(12) United States Patent
Banu et al.

(10) Patent No.: US 6,473,014 B2
(45) Date of Patent: Oct. 29, 2002

(54) SAMPLING DEVICE HAVING AN INTRINSIC FILTER

(75) Inventors: Mihai Banu, Murray Hill, NJ (US); Carlo Samori, Milan (IT)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/756,353

(22) Filed: Jan. 8, 2001

(65) Prior Publication Data

US 2001/0002123 A1 May 31, 2001

Related U.S. Application Data

(62) Division of application No. 09/451,044, filed on Nov. 30, 1999.

(51) Int. Cl.[7] .................................................. H03M 1/00
(52) U.S. Cl. ........................ 341/122; 341/123; 341/111; 325/42
(58) Field of Search ................................. 341/122, 123, 341/143, 111, 113; 324/120; 375/232, 327; 455/202; 327/231; 325/42

(56) References Cited

U.S. PATENT DOCUMENTS

| 4,241,451 | A | * | 12/1980 | Maixner et al. | ............. | 455/202 |
| 4,785,236 | A | * | 11/1988 | Balogh et al. | .............. | 324/120 |
| 5,483,555 | A | * | 1/1996 | Hattori | ........................ | 375/327 |
| 6,181,740 | B1 | * | 1/2001 | Yasuda | ........................ | 375/232 |

* cited by examiner

*Primary Examiner*—Brian Young
*Assistant Examiner*—John B Nguyen
(74) *Attorney, Agent, or Firm*—John Ligon

(57) ABSTRACT

A sampling device for sampling an input signal having intrinsic filter properties. The sampling device samples a continuous analog input signal according to a sampling signal. The sampling device includes a first sampling switch for sampling the input signal, in response to a sampling signal, to create a first set of samples. Furthermore, the sampling device incorporates a time delay device for time delaying the first set of samples. The sampling device also includes a phase shift device for phase shifting the input signal. The phase delayed input signal is then fed into a second sampling switch for sampling in response to the sampling signal to create a second set of samples. Further, a summer is incorporated to sum the first set of samples with the second set of samples to create the output samples.

15 Claims, 4 Drawing Sheets

SAMPLING DEVICE HAVING AN INTRINSIC FILTER

This is a divisional of application Ser. No. 09/451,044, filed on Nov. 30, 1999.

FIELD OF THE INVENTION

The present invention relates to a sample switch, generally, and more particularly, to a sampling circuit having an intrinsic filter.

BACKGROUND OF THE INVENTION

A commercial drive exists for signal processing digitized signals to improve accuracy, reduce power consumption, and lower overall costs. One area employing digital signal processing to a great advantage is wireless communication systems, such as, for example, cellular and cordless telephones. A digital signal processing scheme, however, necessitates the conversion of continuous analog signals into a digital format. This step is typically realized by an analog-to-digital converter ("ADC"). ADCs convert continuous analog signals into discrete digital data by performing a series of functional steps. These processes include sampling, holding, quantizing and encoding.

To formulate an ideal digital representation of an analog signal, several considerations first proposed by Nyquist need to be adhered to in the sampling step. One such condition is that the continuous analog signal to be digitized must be band limited. Secondly, the frequency of the sampling in the digitization process need be at least twice the bandwidth of the analog signal.

However, if either or both of the Nyquist considerations are not followed, a distinctive error may be realized in the sampled signal. This error, also referred to as aliasing, mixes various frequency components to create distortion. Various solutions are known to minimize the impact of the issue of aliasing errors. One known approach employs filters prior to sampling the analog signal for removing the essential signal energy outside the required band limited spectrum.

While providing relief for the aliasing errors, pre-sampling filters require tradeoffs. First, pre-sampling filters are engineering intensive in terms of design, taking into consideration the application of the ADC. Moreover, pre-sampling filters are typically realized by discrete passive componentry, such as a surface acoustic wave ("SAW") device, which are relatively expensive.

As such, there is a need for a sampling scheme in an ADC which reduces aliasing errors without creating engineering intensive and application specific designs. There also exists a demand for a sampling scheme in an ADC which reduces aliasing errors at a cost savings over the known approaches.

SUMMARY OF THE INVENTION

One advantage of the present invention is to provide a sampling device which reduces aliasing errors without creating engineering intensive and application specific designs.

Another advantage of the present invention is to provide a sampling device which reduces aliasing errors at minimal additional cost over the known approaches.

In one embodiment of the present invention, a sampling device is disclosed having intrinsic filtering properties. The sampling device samples a continuous analog input signal according to a sampling signal. In another embodiment of the present invention, the input signal to be sampled comprises an intermediate frequency ("IF") band. The sampling device comprises a first sampling switch for sampling the input signal, in response to a sampling signal, to create a first set of samples. Furthermore, the sampling device comprises a time delay device for time delaying the first set of samples. The sampling device also comprises a phase shift device for phase shifting the input signal. The phase delayed input signal is then fed into a second sampling switch for sampling in response to the sampling signal to create a second set of samples. Further, a summer is incorporated to sum the first set of samples with the second set of samples to create the output samples.

In a further embodiment of present invention, the time delay device is realized by an analog memory element or device for time delaying each sample of the first set of samples for one sampling period of the sampling signal. In an embodiment of the present invention, the input signal is phased delayed by approximately $\pi/2$ radians.

In another embodiment of the present invention, the input signal is fed into a mixer having a first and a second mixed output. The second mixed output is thereafter phase shifted to be out of phase with the first mixed output by a predetermined amount. In a further embodiment, this predetermined amount is approximately $\pi/2$ radians.

In yet another embodiment of the present invention, the first and second sampling switches are formed utilizing at least one MOS transistor. With respect to the first sampling switch, the gate of the MOS transistor receives the sampling signal, the source receives the continuous analog input signal, and the drain creates samples that are fed into the time delay device. Similarly, the gate of the second sampling switch receives the sampling signal, the source receives the phased delayed input signal, while the drain creates the second set of samples.

In another embodiment of the present invention, an analog to digital converter is disclosed which employs a sampling device for sampling the analog input signal and creating output samples. The sampling device comprises a number of branches, j, where j is a whole number greater than one. Each branch comprises a phase shift device having a phase shift coefficient for phase shifting the input signal. The phase delay coefficient comprises the difference between j and k, where k is a whole number between one and j. Further, each branch comprises a sampling switch for sampling the phase shifted input signal in response to a sampling signal to create a set of samples. A time delay device is incorporated on each branch for time delaying the set of samples of the respective branch. Each time delay device also has a time delay coefficient corresponding with the terms of a Z transform. Moreover, each branch comprises an amplifier for amplifying the time delayed set of samples. Each amplifier has a gain coefficient corresponding with the terms of a Z transform. The sampling device also comprises a summer for summing the amplified time delayed set of samples from each branch to generate output samples. The analog to digital converter further includes a holding device for holding the output samples, a quantizing device for quantizing the output samples, and an encoding device for encoding the quantized output samples.

In another embodiment of the present invention, an electronic device is disclosed for receiving an input radio frequency ("RF") signal, and for generating a digital signal. The electronic device comprises an RF filter for filtering the input RF signal, an amplifier for amplifying the filtered input RF signal, an RF mixer having an RF oscillator for mixing the amplified filtered input RF signal, an intermediate frequency ("IF") filter for filtering the RF mixed, amplified and filtered input RF signal, and an analog to digital converter for converting the filtered, RF mixed, amplified and filtered input RF signal into a digital signal. The analog to digital converter comprises a sampling device for sampling the filtered, RF mixed, amplified and filtered input RF signal and creating output samples. The sampling device comprises a first sampling switch for sampling the filtered, RF mixed, amplified and filtered input RF signal in response to a sampling signal to create a first set of samples. The sampling device also comprises a time delay device for time delaying the first set of samples. Further, the sampling device comprises a phase shift device for phase shifting the filtered, RF mixed, amplified and filtered input RF signal, and a second sampling switch for sampling the phase shifted, filtered, RF mixed, amplified and filtered input RF signal in response to the sampling signal to create a second set of samples. The sampling device also comprises a summer for summing the first and second set of samples to generate the output samples. Moreover, the analog to digital converter comprises a holding device for holding the output samples, a quantizing device for quantizing the output samples, and an encoding device for encoding the quantized output samples to create the digital signal.

These embodiments, objects and other advantages will become apparent to those skilled in the art from the following detailed description read in conjunction with the appended claims and the drawings attached hereto.

BRIEF DESCRIPTION OF THE DRAWINGS

The present invention will be better understood from reading the following description of non-limiting embodiments, with reference to the attached drawings, wherein below.

It should be emphasized that the drawings of the instant application are not to scale but are merely schematic representations and are not intended to portray the specific parameters or the structural details of the invention, which can be determined by one of skill in the art by examination of the information herein.

DETAILED DESCRIPTION OF THE PRESENT INVENTION

Figure 1:
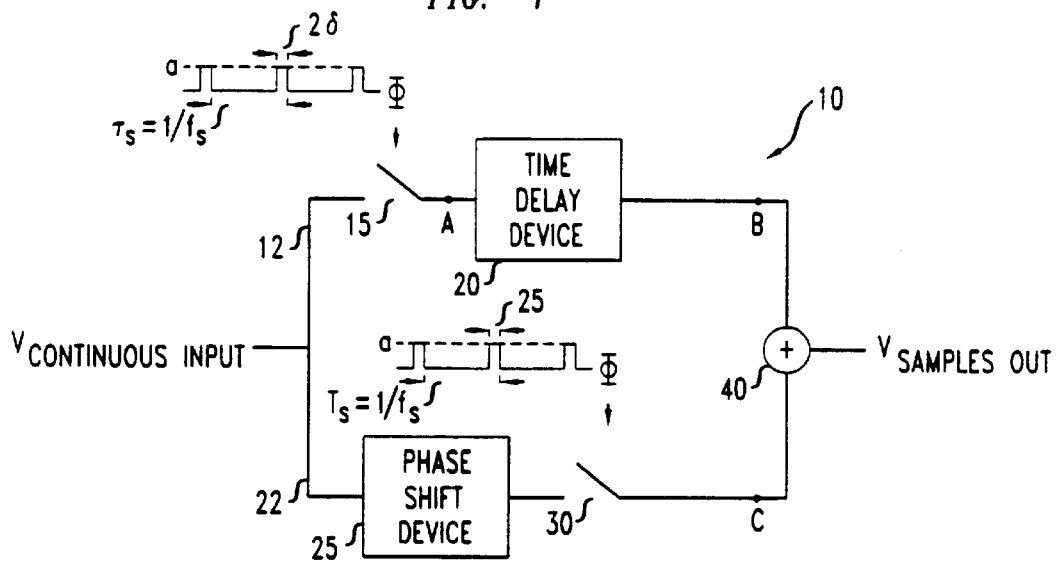
FIG. 1 illustrates a block diagram according to an embodiment of the present invention.

Referring to FIG. 1, a block diagram of a sampling device 10 is illustrated according to an embodiment of the present invention. Sampling device 10 receives $V_{CONTINUOUS\ INPUT}$ as an input, and accordingly samples the input, $V_{CONTINUOUS\ INPUT}$, in response to a sample signal. As will be understood from the hereinbelow detailed description, by sampling $V_{CONTINUOUS\ INPUT}$ utilizing the present invention, at least one aliasing image is removed intrinsically by sampling device 10.

Sampling device 10 comprises at least two branches, 12 and 22, each of which receive $V_{CONTINUOUS\ INPUT}$ as an input. First branch 12 samples $V_{CONTINUOUS\ INPUT}$ and generates a first set of samples that are time delayed, while second branch 22 samples a phase shifted $V_{CONTINUOUS\ INPUT}$ to create a second set of samples. The resultant first and second sample sets are added by a summer 40 to create the output samples, $V_{SAMPLES\ OUT}$. It should be apparent to one of ordinary skill, however, from the disclosure hereinbelow, that a subtracter may be used in the present invention as a substitute for summer 40 to achieve the same results. By the design of sampling device 10, generally, and more specifically, first and second branches, 12 and 22, at least one aliasing image is removed.

For sampling device 10 to intrinsically filter at least one aliasing image first branch 12 comprises a sampling switch 15 which samples $V_{CONTINUOUS\ INPUT}$ according to a sampling signal, $\Phi$. Sampling signal, $\Phi$, operates at a sampling frequency, $f_s$. Sampling switch 15 is coupled with a time delay device 20 at a node A. In so doing, the first set of samples created by a first sampling switch 15 are delayed according to a predetermined time interval. In one embodiment of the present invention, the predetermined time interval comprises a delay equal to one sampling period, such that for a sample, n, created by sampling switch 15, time delay device 20 generates the sample n−1 as an output. In another embodiment of the present invention, time delay device 20 is realized by an analog memory device, such as a switched capacitor circuit. Time delay device 20 is also coupled with summer 40 at a node B to complete first branch 12 of sampling device 10.

Second branch 22 of sampling device 10 comprises a phase shift device 25. Device 25 phase shifts input signal, $V_{CONTINUOUS\ INPUT}$, according to a predetermined phase shift. It should be noted that the predetermined phase shift corresponds with the predetermined time interval. In one embodiment of the present invention, the predetermined phase shift is $\pi/2$ radians or 90°. Phase shift device 25 is coupled with a second sampling switch 30. As a result, input signal $V_{CONTINUOUS\ INPUT}$, as phase shifted by device 25, is sampled in response to sampling signal, $\Phi$, at the sampling frequency, $f_s$. Second sampling switch 30 is also coupled with summer 40 at node C, such that the phase shifted samples thereby created are summed with the timed delayed samples of first branch 12 to create output samples, $V_{SAMPLES\ OUT}$. In so doing, at least one aliasing image is intrinsically filtered.

Figure 2:
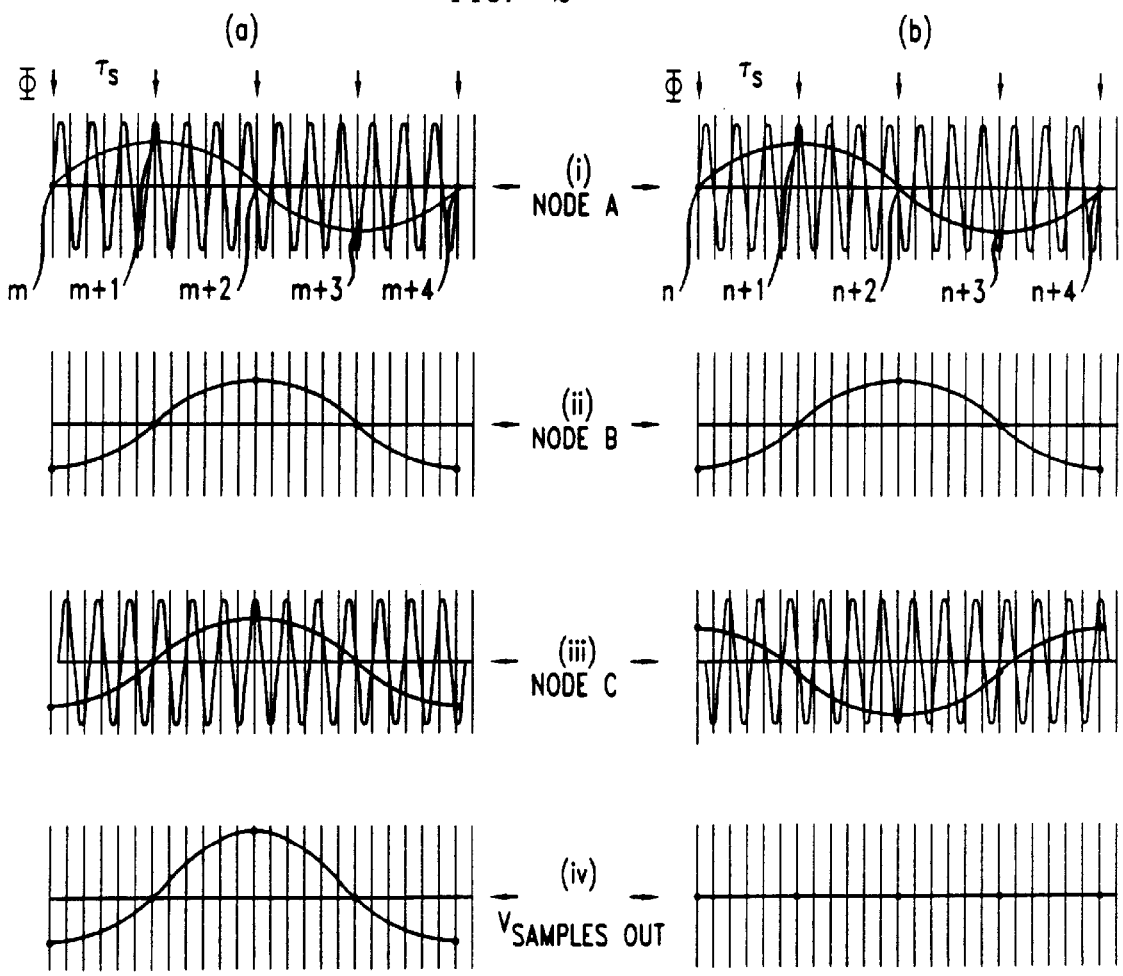
FIGS. 2(a) and 2(b) illustrate a series of graphs each depicting characteristics according to an embodiment of the present invention.

Referring to FIGS. 2(a) and 2(b), the responses of sampling device 10 of FIG. 1 at nodes A, B, C, and the resultant output, $V_{SAMPLES\ OUT}$, are illustrated. FIG. 2(a) depicts the characteristics of sampling device 10 at nodes A, B, C, and the resultant output, with respect to a desired frequency component of the input signal. Likewise, FIG. 2(b) depicts the characteristics of the sampling device at nodes A, B, C, with respect to an undesired frequency component of the input signal. In one embodiment, the desired frequency component of the input signal is $3f_s+(\frac{1}{4})f_s$, while the undesired component is $3f_s-(\frac{1}{4})f_s$.

Referring to FIG. 2(a)(i), the characteristics at node A of the sampling switch 15 in response to receiving a desired frequency component of $V_{CONTINUOUS\ INPUT}$ are shown. Here, it should be noted that the resultant samples, m, m+1, m+2, m+3, m+4, created by switch 15 correspond in time with each pulse of sampling signal $\Phi$.

As a result of time delay device 20 of FIG. 1, the samples m, m+1, m+2, m+3, m+4 at node B are shown in FIG. 2(a)(ii) as being time delayed. Time delay device 20 delays each of the samples one sampling period, such that sample m, for example, is held in time for one sample period. In so doing, at the time sample m+1 is created, sample m is output by time delay device 20. Likewise, sample m+1 is output when sample m+2 is created, sample m+2 is output when sample m+3 is created, sample m+3 is output when sample m+4 is created, and sample m+4 is output when sample m+5 is created.

In the second branch 22 of FIG. 1, $V_{CONTINUOUS\ INPUT}$ is fed into phase shift device 25 such that the signal is phase shifted by $\pi/2$ radians or 90° and subsequently sampled. The characteristics of the resultant phased shifted samples are illustrated in FIG. 2(a)(iii). Thereafter, summer 40 sums the time delayed samples of FIG. 2(a)(ii) with the phase shifted samples of FIG. 2(a)(iii) to produce the $V_{SAMPLES\ OUT}$ in FIG. 2(a)(iv).

It should be apparent to one of ordinary skill in the art from FIG. 2(a)(iv), that by summing the samples at node B and C, this aspect of the present invention utilizes the principle of constructive interference to embellish the resultant samples in $V_{SAMPLES\ OUT}$.

In contrast to FIG. 2(a), FIG. 2(b) illustrates the intrinsic filtering characteristics of sampling device 10 of FIG. 1 in removing at least one aliasing image. Referring to FIG. 2(b)(i), the characteristics at node A of sampling switch 15 in response to receiving an undesired frequency component of $V_{CONTINUOUS\ INPUT}$ are shown. Samples n, n+1, n+2, n+3, n+4 are created by switch 15 corresponding in time with each pulse of sampling signal Φ.

As a result of time delay device 20 of FIG. 1, the samples n, n+1, n+2, n+3, n+4 at node B are shown in FIG. 2(b)(ii) as being time delayed. Time delay device 20 delays each of the samples one sampling period, such that sample n, for example, is held in time for one sample period. In so doing, at the time sample n+1 is created, sample n is output by time delay device 20. Likewise, sample n+1 is output when sample n+2 is created, sample n+2 is output when sample n+3 is created, sample n+3 is output when sample n+4 is created, and sample n+4 is output when sample n+5 is created.

In the second branch 22 of FIG. 1, $V_{CONTINUOUS\ INPUT}$ is fed into phase shift device 25 such that the signal is phase shifted by $\pi/2$ radians or 90° and subsequently sampled. The characteristics of the resultant phased shifted samples are illustrated in FIG. 2(b)(iii). Thereafter, summer 40 sums the time delayed samples of FIG. 2(b)(ii) with the phase shifted samples of FIG. 2(b)(iii) to produce the $V_{SAMPLES\ OUT}$ of FIG. 2(b)(iv).

By summing the samples at node B and C, it should be apparent to one of ordinary skill in the art that the present invention utilizes the principle of destructive interference to cancel out the resultant samples created by the undesired frequency component of $V_{CONTINUOUS\ INPUT}$.

Figure 3A:
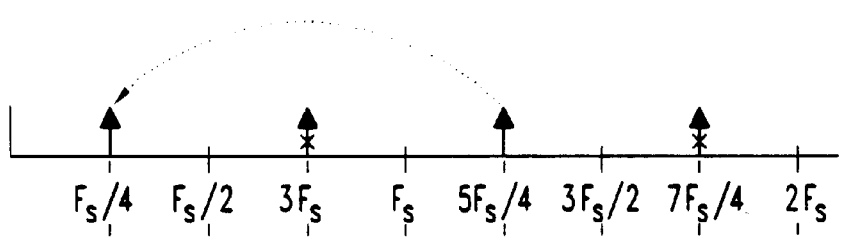
FIGS. 3(a), 3(b) and 3(c) illustrate a series of graphs each depicting characteristics according to an embodiment of the present invention.
Figure 3B:
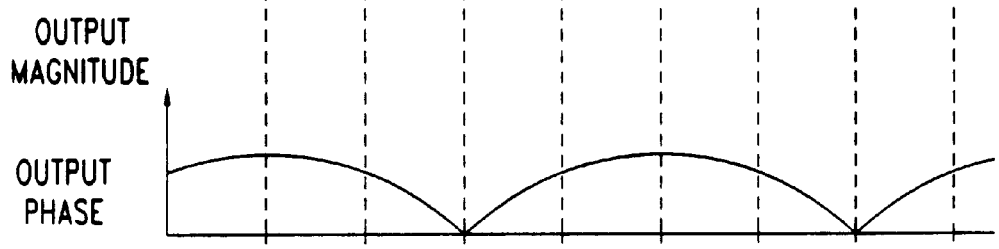
Figure 3C:
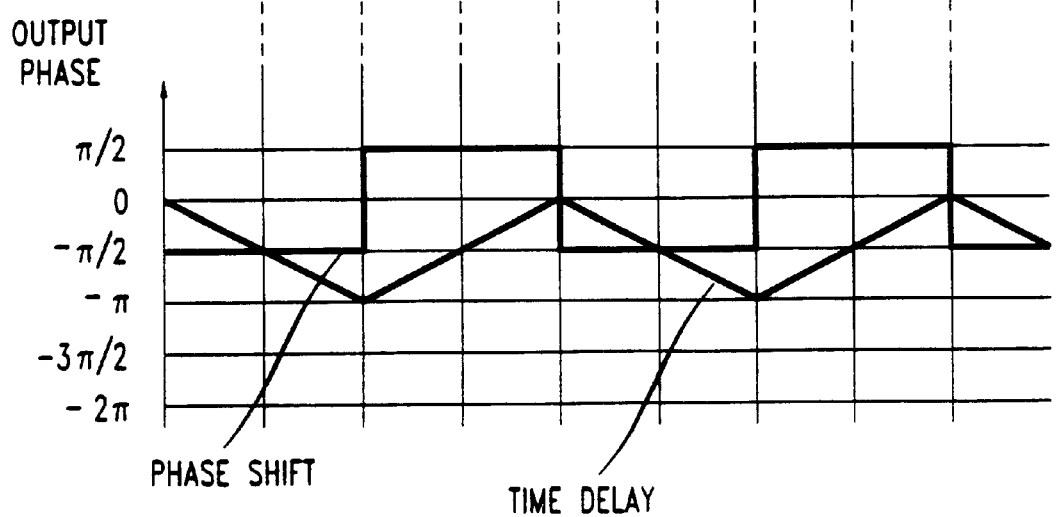

Referring to FIGS. 3(a), 3(b) and 3(c), the output magnitude response of the present invention is illustrated as a function of the input frequency. Various multiples associated with a sampling frequency are shown in FIG. 3(a). FIG. 3(b) illustrates the output magnitude of sampling device 10 of FIG. 1 as a function of the frequency of the input signal, where the delay of time delay device 20 is one sample, and the shift of phase shift device 25 is $\pi/2$ radians or 90°. Likewise, FIG. 3(c) depicts the phase response of branches 12 and 22 of sampling device 10 as a function of the input frequency.

From FIGS. 3(a) and 3(b), it should be apparent to one of ordinary skill that sampling device 10 comprises notch filter characteristics such that $(3/4+k) \cdot f_s$ corresponds with a diminished output, while $(1/4+k) \cdot f_s$ corresponds with a maximized output, where k is a whole number. This is further supported by FIGS. 3(b) and (c), where the time delay and phase shift are characterized by the input frequency versus output magnitude and phase, respectively.

From overlaying the time delay and phase shift in FIG. 3(c), it should be apparent that when both lines intersect at $-\pi/2$ radians or 90°, the output phase characteristics of the sampling device are maximized. This corresponds with a maximum output magnitude in FIG. 3(b) and corresponds with frequencies points $(1/4+k) \cdot f_s$. Similarly, the output phase characteristics are minimized when the difference in phase of the time delay and phase shift lines is zero. This corresponds with filtered frequencies points of $(3/4+k) \cdot f_s$ each having a minimized output magnitude in FIG. 3(b).

From FIGS. 3(a), 3(b) and 3(c), given the parameters of time delay device 20 delaying each sample one sampling period, and the phase shift of device 25 being $\pi/2$ radians or 90°, the intrinsic filter capabilities of sampling device 10 correspond with a minimized output magnitude at $(3/4+k) \cdot f_s$, and a maximized output magnitude at $(1/4+k) \cdot f_s$. Thus, in view of FIGS. 3(a), 3(b) and 3(c), input frequencies corresponding with the $(3/4+k) \cdot f_s$ have a minimized output response and thus are filtered by destructive interference using the classical physics definition. Similarly, input frequencies corresponding with the $(1/4+k) \cdot f_s$ have a maximized output response, relying on constructive interference using the classical physics definition.

It should be apparent to one of ordinary skill that by employing the present invention in view of these intrinsic characteristics, a sampling notch characteristic is created for providing attenuation to thereby lower the requirement for additional filters or their precision in a system. In one embodiment of the present invention, a savings of greater than 30 db was obtained utilizing the intrinsic filtering characteristics of the present invention.

Figure 4:
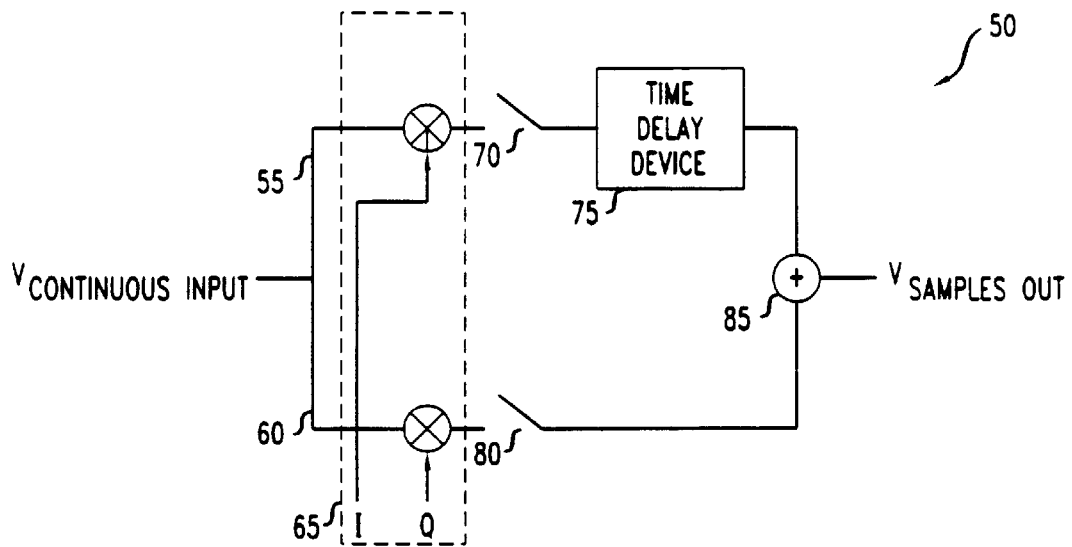
FIG. 4 illustrates a block diagram according to another embodiment of the present invention.

Referring to FIG. 4, a block diagram of a sampling device 50 is illustrated according to another embodiment of the present invention. Sampling device 50 comprises a quadrature phase splitter 65. Quadrature phase splitter 65 creates a phase differential between first branch 55 and second branch 60 of device 50. Operationally, quadrature phase splitter 65 mixes I and Q with input signal, $V_{CONTINUOUS\ INPUT}$, along first and second branches, 55 and 60, to create Hilbert transforms. As a result of quadrature phase splitter 65, the phase spectra of the first and second paths differ by approximately $\pi/2$ radians or 90°, as one branch is phase delayed by such an amount, all while the magnitude spectra of both remain substantially equivalent.

Figure 5:
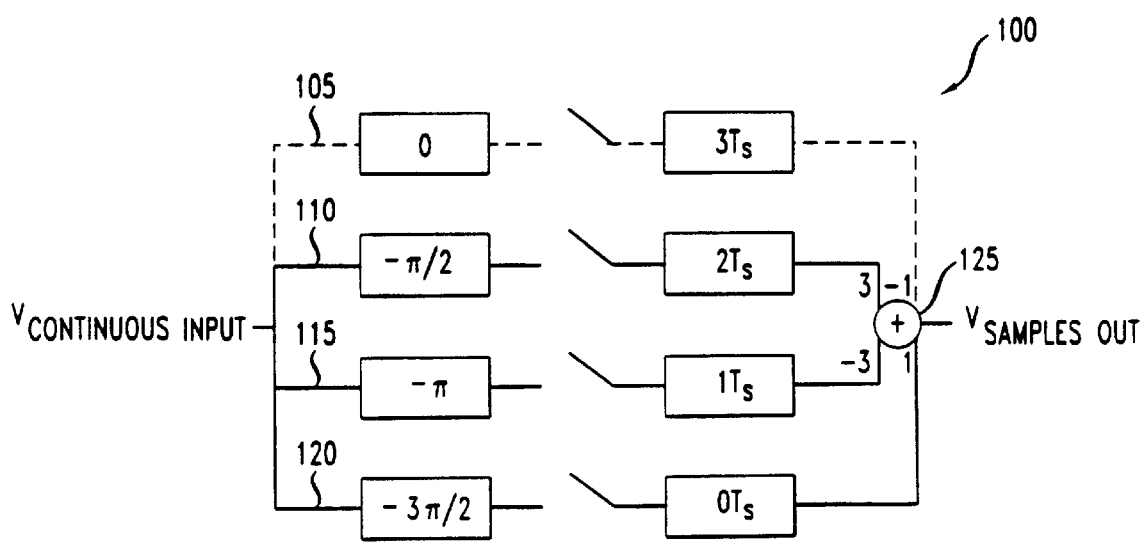
FIG. 5 illustrates a block diagram according to another embodiment of the present invention.

Referring to FIG. 5, a block diagram of a sampling device 100 is illustrated according to another embodiment of the present invention. Sampling device 100 comprises intrinsic filtering characteristics having enhanced attenuation created by the addition of several more branches having calculable time and phase delays. The phase and time delay of each branch, and the amplification coefficients are reflection of the number of branches and an appropriate Z transform. In view of this mathematical relationship, sampling device 10 of FIG. 1, for example, corresponds with $(1-z^{-1})^r$, or $(1-z^{-1})^1$, where r is equal the difference between the number of branches and 1. It should be apparent to one of ordinary skill in the art that other models may be substituted for the Z transform approach expressed herein.

As shown, sampling device 100 comprises four branches. Thus, sampling device 100 correlates to $(1-z^{-1})^{[4-1]}$ or $(1-z^{-1})^3$. The expression $(1-z^{-1})^3$ may also be represented as $1-3z^{-1}+3z^{-2}-z^{-3}$. The phase shift associated with each branch may be expressed as a multiple of $-\pi/2$ radians, such that first branch 110, much like branch 12 of FIG. 1, comprises a phase shift of $(1-1)\times\pi/2$ radians, or 0°. The time delay of branch 110, given the number of branches in device 100, comprises three sampling periods, corresponding with the "$z^{-3}$" term of the above mathematical expression. The coefficient to this term in the hereinabove mathematical expression associated with branch 110 is $-1$, which is reflected in at the point of summation of the branches, summer 125. This coefficient translates to an amplifier having a $-1$ gain.

Similarly, second branch 110 of device 100 comprises a phase shift equal to $(1-2)\times\pi/2$ radians, or 90°. Branch 110 also comprises a time delay equal to two sampling periods corresponding mathematically with the "$+3z^{-2}$" term of the above mathematical expression, wherein the $+3$ coefficient is reflected in summer 125. This coefficient corresponds with an amplifier having a $+3$ gain.

Branch 115 comprises a phase shift of $(1-3)\times\pi/2$ radians, or $-180°$. Moreover, branch 115 comprises a time delay of one sampling period. These correspond with the "$-3z^{-1}$" term of the above mathematical expression, wherein the $-3$ coefficient is reflected in summer 125. This coefficient corresponds with an amplifier having a $-3$ gain.

Finally, branch 120 comprises a phase shift of $(1-4)\times\pi/2$ radians, or $-270°$. Branch 120 comprises no time delay, given the above mathematical expression. Moreover, the "1" term is reflected in summer 125. This coefficient corresponds with an amplifier having a gain of 1.

By the above configuration, the sampling notch created by the increased number of branches of sampling device 100 provides greater attenuation and thus lessens the requirement of a system to include additional filters. It should be apparent to one of ordinary skill in the art, however, that numerous variations on the total number of branches and their arrangements are available to maximize the benefits of the present invention.

Figure 6:
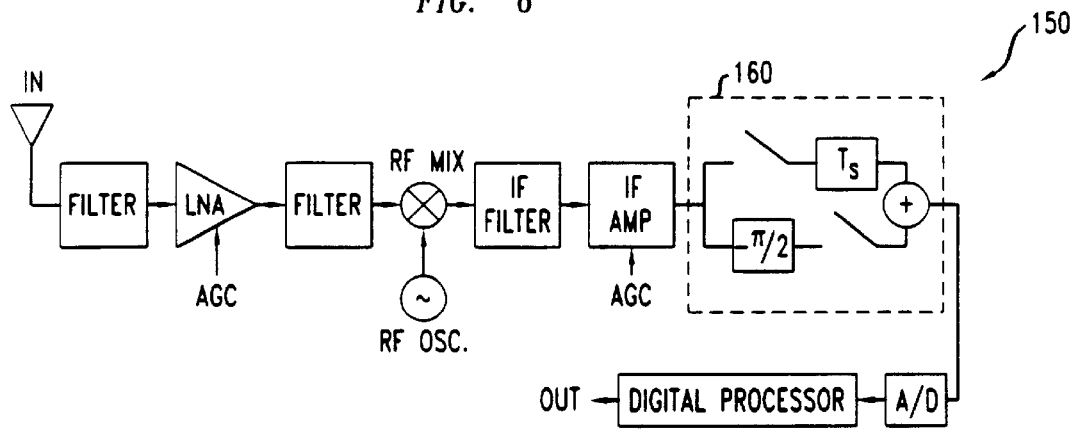
FIG. 6 illustrates a block diagram according to another embodiment of the present invention.

Referring to FIG. 6, a block diagram of an intermediate frequency ("IF") sampled receiver 150 is illustrated according to another embodiment of the present invention. IF sampled receiver 150, as shown, comprises a sampling device 160, which is comparable in design to sampling device 10 of FIG. 1. Upon receiving a filtered radio frequency ("RF") input, a low noise amplifier ("LNA") utilizing automatic gain control ("AGC") amplifies the filtered RF input. This amplified filtered RF signal is filtered again, mixed with an RF oscillator, and the fed into an IF filter. The IF filtered result is then fed into an IF amplifier having AGC. The output of IF amplifier with AGC is then fed into sampling device 160 for intrinsically removing unwanted frequencies from the IF amplifier with AGC output. Sampling device 160 is subsequently coupled to the remaining components of an ADC to convert the output samples into digital data for subsequent digital processing.

Figure 7A:
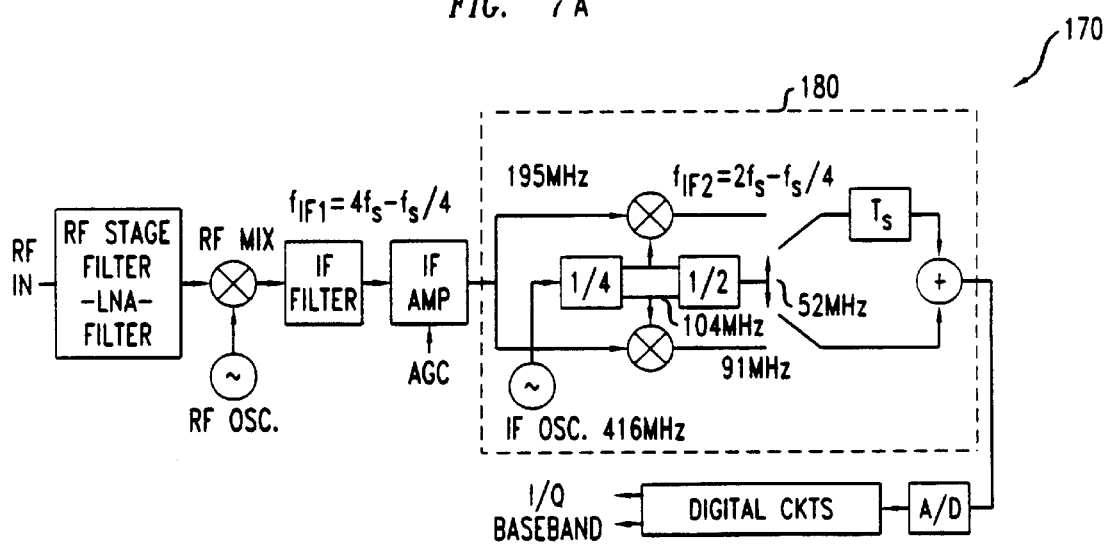
FIGS. 7(a) and 7(b) illustrate a block diagram and a graphical representation of a set of its characteristics according to another embodiment of the present invention.

Referring to FIGS. 7(a), a block diagram of a global systems for mobile communications ("GSM") sampled receiver 170 is illustrated according to another embodiment of the present invention. GSM sampled receiver 170, as shown, comprises a sampling device 180 utilizing the scheme of the present invention detailed hereinabove.

GSM sampled receiver 170 receives an RF input, which is filtered, amplified using an LNA with AGC, and filtered again. The twice filtered and amplified input is then mixed with an RF oscillator, and fed into an IF filter. The IF filtered result is subsequently fed into an IF amplifier having AGC. The output of the IF amplifier with AGC is then fed into sampling device 180 incorporating a quadrature phase splitter having an IF oscillator. As a result of the quadrature phase splitter, a first and a second branch of sampling device 180 propagate the output of the IF amplifier, such that the second branch is $-\pi/2$ radians or 90° phase shifted with respect to the first branch. The quadrature phase splitter adds an additional IF frequency component. Thereafter, each branch is fed to a sampling switch sharing a sample signal operating at a sample frequency, $f_s$. Thereafter, a time delay delays each sample created by the sampling switch along the first branch for one sample period, and then a summer sums the products of both branches to create output samples. Sampling device 180 is subsequently coupled to the remaining components of an ADC to convert the output samples created to digital data and thereafter fed into a digital processor for processing.

In one embodiment of the present invention, the sampling frequency, $f_s$, of sampling device 180 is approximately 52 MHz, while the IF oscillator oscillates at a frequency of 416 MHz. Moreover, the output of IF filter in GSM receiver 170 passes an IF frequency which is equal to $[4f_s-(f_s/4)]$, or 195 MHz, while the quadrature phase splitter adds a second IF frequency equal to $[2f_s-(f_s/4)]$ of 91 MHz.

Figure 7B:
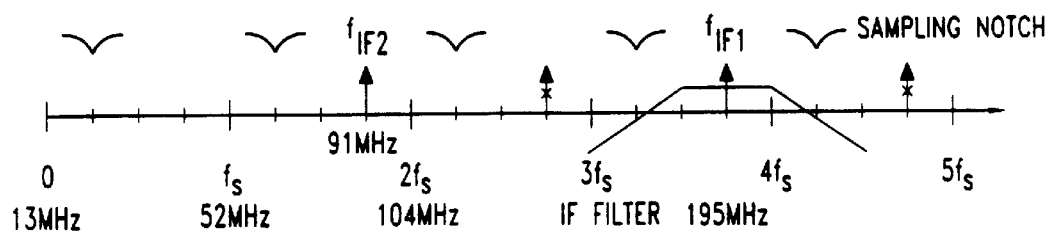

Referring to FIG. 7(b), a graphical representation of the intrinsic filtering characteristics of sampling device 180 in GSM receiver 170 is shown. From the illustration, it should be apparent to one of ordinary skill in the art that sampling device 180 creates sampling notches over the frequency spectrum which may be employed as a means for reducing the IF filtering requirements of devices, such as GSM receiver 170. It should also be apparent to one of ordinary skill in the art that frequencies at $(\frac{3}{4}+k)\cdot f_s$, where k is a whole number, are filtered out, as detailed hereinabove and with reference to FIGS. 3(a), 3(b) and 3(c), by the intrinsic filtering characteristics of sampling device 180.

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. It is therefore contemplated that the appended claims will cover any such modifications or embodiments as fall within the true scope of the invention.

What is claimed is:

1. A method of removing at least one aliasing image from a plurality of output samples, the method comprising:
   sampling an input signal at a given sampling rate to generate a first set of samples of the input signal,
   time delaying the first set up samples of the input signal, wherein the time delay is an integral multiple of the period of the sampling rate;
   phase shifting the input signal and sampling the phase-shifted input signal to generate a second set of samples; and
   summing the first and second set of samples to remove at least one aliasing image.

2. The method of claim 1, wherein the first set of samples are formed by sampling the input signal according to a first sampling signal having a sampling period, and the first set of samples being time delayed by a predetermined time interval corresponding with the sampling period.

3. The method of claim 1, wherein the sampled input signal is phase shifted in forming the second set of samples by a predetermined phase shift corresponding with $\pi/2$ radians.

4. A sampling system for sampling an input signal to generate a set of output samples, the sampling device comprising an intrinsic filter for removing at least one aliasing image from the output samples by interference, wherein the intrinsic filter operates to provide a time delay between a first set of samples of the input signal and a second, phase-shifted set of samples of the input signal, and further wherein the time delay is an integral multiple of the sampling period.

5. The sampling system of claim 4, wherein the intrinsic filter comprises:

a time delaying sampling device for generating a time delayed set of samples of the input signal;

a phase shifting sampling device for generating a phase shifted set of samples of the input signal; and a summer for summing the time delayed set of samples with the phase shifted set of samples to remove at least one aliasing image.

6. The sampling system of claim 5, wherein the time delaying sampling device comprises:

a first sampling switch for sampling the input signal; and a time delay device for generating the time delayed set of samples of the input signal.

7. The sampling system of claim 6, wherein the first sampling switch generates a set of samples according to a first sampling signal having a sampling period, the set of samples being timed delayed by a predetermined time interval to create the time delayed set of samples, the predetermined time interval corresponding with the sampling period.

8. The sampling system of claim 7, wherein the phase shifting sampling device comprises:

a phase shifting device for phase shifting the input signal; and a second sampling switch for sampling the phase shifted input signal to generate the phase shifted set of samples of the input signal.

9. The sampling system of claim 8, wherein the input signal is phase shifted by a predetermined phase shift corresponding with $\pi/2$ radians.

10. The sampling system of claim 5, wherein the input signal is coupled with a mixer having a first and a second mixed output, the second mixed output being out of phase with the first mixed output by $-\pi/2$ radians.

11. The sampling system of claim 5, further comprising a phase and time shifting sampling device for generating a phase and time shifted set of samples of the input signal.

12. The sampling system of claim 11, wherein the time delaying sampling device comprises:

a first sampling switch for sampling the input signal; and a time delay device for generating the time delayed set of samples of the input signal according to a first predetermined time delay, wherein the phase shifting sampling device comprises:

a phase shifting device for phase shifting the input signal by a first predetermined phase shift; and a second sampling switch for sampling the phase shifted input signal to generate the phase shifted set of samples of the input signal;

and wherein phase and time shifting sampling device comprises:

a second phase shifting device for phase shifting the input signal by a second predetermined phase shift;

a second sampling switch for sampling the second phase shifted input signal to generate the second phase shifted set of samples of the input signal; and a second time delay for time delaying the second phase shifted set of samples by a second predetermined time delay, the summer summing the time delayed set of samples, the phase shifted set of samples and the timed delayed amplified phased set of samples.

13. The sampling system of claim 12, wherein the phase and time shifting sampling device further comprises an amplifier, having a predetermined gain, for amplifying the second phase shifted input signal.

14. The sampling system of claim 13, wherein the first predetermined time delay is equal to one sampling period of a first sampling signal for enabling first sampling switch, the second predetermined time delay is equal to two sampling periods of a second sampling signal for enabling second sampling switch, the first predetermined phase shift is equal to $\pi$ radians, the second predetermined phase shift is equal to $\pi/2$ radians, and the predetermined gain of the amplifier is $-2$.

15. A sampling system for sampling an input signal to generate a set of output samples, the sampling device comprising an intrinsic filter for removing at least one aliasing image from the output samples by interference wherein the intrinsic filter comprises:

a time delaying sampling device for generating a time delayed set of samples of the input signal;

a phase shifting sampling device for generating a phase shifted set of samples of the input signal;

a phase and time shifting sampling device for generating a phase and time shifted set of samples of the input signal; and a summer for summing the time delayed set of samples with the phase shifted set of samples and the phase and time shifted set of samples to remove at least one aliasing image;

wherein the time delaying sampling device comprises:

a first sampling switch for sampling the input signal; and a time delay device for generating the time delayed set of samples of the input signal according to a first predetermined time delay;

wherein the phase shifting sampling device comprises:

a phase shifting device for phase shifting the input signal by a first predetermined phase shift; and a second sampling switch for sampling the phase shifted input signal to generate the phase shifted set of samples of the input signal;

wherein the phase and time shifting sampling device comprises:

a second phase shifting device for phase shifting the input signal by a second predetermined phase shift in:

a second sampling switch for sampling the second phase shifted input signal to generate the second phase shifted set of samples of the input signal; and a second time delay for time delaying the second phase shifted set of samples by a second predetermined time delay;

wherein the first predetermined time delay is equal to one sampling period of a first sampling signal for enabling first sampling switch, the second predetermined time delay is equal to two sampling periods of a second sampling signal for enabling second sampling switch, the first predetermined phase shift is equal to $\pi$ radians, and the second predetermined phase shift is equal to $\pi/2$ radians.

* * * * *